United States Patent [19]

Tanaka et al.

[11] 4,323,865
[45] Apr. 6, 1982

[54] LADDER-TYPE PIEZOELECTRIC FILTER

[75] Inventors: Yasuhiro Tanaka, Kashimamachi; Sasuga Kakehi, Kanazawa, both of Japan

[73] Assignee: Murata Manufacturing Co., Ltd., Japan

[21] Appl. No.: 109,283

[22] Filed: Jan. 3, 1980

[30] Foreign Application Priority Data

Jan. 11, 1979 [JP] Japan .................................. 54-2495

[51] Int. Cl.³ ........................ H03H 9/54; H03H 9/58; H03H 9/52
[52] U.S. Cl. .................................. 333/187; 333/189; 333/190
[58] Field of Search ............................... 333/186–192; 310/325, 340, 342, 348, 351, 366

[56] References Cited

U.S. PATENT DOCUMENTS

| | | | |
|---|---|---|---|
| 2,155,035 | 4/1939 | Bieling | 333/187 X |
| 2,326,923 | 8/1943 | Bokovoy | 310/354 |
| 3,408,515 | 10/1968 | Morse | 333/187 X |
| 3,601,639 | 8/1971 | Hannon et al. | 333/187 X |
| 4,066,986 | 1/1978 | Takano et al. | 333/188 |

Primary Examiner—Marvin L. Nussbaum
Attorney, Agent, or Firm—Ostrolenk, Faber, Gerb & Soffen

[57] ABSTRACT

There are provided ladder-type piezoelectric filters, wherein each piezoelectric resonator incorporated is arranged to have opposing faces of rectangular dimensions with the ratio of a short side length to a long side length being less than a value of 0.7.

6 Claims, 10 Drawing Figures

LADDER-TYPE PIEZOELECTRIC FILTER

BACKGROUND OF THE INVENTION

This invention relates to a piezoelectric filter of the ladder type and more particularly, to an improved piezoelectric filter of the above-described type wherein a plurality of piezoelectric resonators are accommodated in a casing such that it is formed in a compact unit having improved spurious signal characteristics.

Conventionally, a piezoelectric filter of the ladder type is constituted by a plurality of piezoelectric resonators each utilizing a face vibration. As shown in FIG. 1, a typical piezoelectric resonator 4 includes a piezoelectric substrate 1 of a square shape, having its opposing surfaces coated or deposited with electrode layers 2 and 3 of known fabrication. However, when the piezoelectric filter of the above-described type is further arranged to be constructed compactly with the piezoelectric resonator of the square shape, the thickness of the piezoelectric substrate per se has to be much smaller. Such being the case, both the resistance to impact and the resistance to vibration specific to the resultant piezoelectric filter tend to be intolerably low. In addition, since the face shape of the piezoelectric resonator 4 is square, substantial spurious signals are generated in a frequency band of approximately 1.4 times the central frequency of the resultant filter and cannot be avoided. Alternatively, in order to prevent the occurrence of spurious signals, the adoption of a piezoelectric resonator having a circular construction has been proposed. However, when the piezoelectric resonator is formed in a circular construction, with its resonance characteristics being the same as those of a piezoelectric resonator having the square construction, the resultant piezoelectric resonator may inherently involve an increase in size of 10 to 15 percent. Such being the case, as far as the ladder-type filter is concerned, since the number of the piezoelectric resonators is increased with the number of the ladder-stages to be employed, substantially higher manufacturing cost for the piezoelectric substrates or the like cannot be avoided.

SUMMARY OF THE INVENTION

Accordingly, an essential object of the present invention is to provide a ladder-type piezoelectric filter, which is compact in size, with the occurrence of the spurious outputs in the vicinity of the central frequency of the filter being arranged to be suppressed as far as possible.

Another important object of the present invention is to provide a ladder-type piezoelectric filter of the above-described type, which is formed from a plurality of rectangular piezoelectric resonators each having a specifically suppressed spurious characteristic.

A further object of the present invention is to provide a ladder-type piezoelectric filter of the above-described type which can be manufactured at low cost.

In accomplishing these and other objects according to the present invention, there is provided a two-staged ladder-type piezoelectric filter, wherein respective piezoelectric resonators incorporated are arranged to have each opposing surfaces of rectangular dimensions with the ratio of a short side length to a long side length being less than a value of 0.7. A piezoelectric material for constituting the resonator is one selected from the group of $Pb(Zr,Ti)O_3$.

More specifically, according to the present invention, the ladder-type piezoelectric filter comprises a housing of electrically insulating material, two paired piezoelectric resonators each including a series piezoelectric resonator and a parallel piezoelectric resonator of the above-described type, an electric insulating spacer, a plurality of terminal members each integrally having one electroconductive protuberant contact and made of a resilient material, four lead terminals of which two serve as an input terminal member and an output terminal member, respectively, for the terminal members and four lead wires selectively electrically connected among the terminal members and the lead terminals. The housing has a U-shaped cross section while its substantially inner long side length of respective lateral, rectangular sides is arranged to be equivalent to the long side length of each piezoelectric resonator so that it is capable of housing them, with these long side dimensions of the respective piezoelectric resonators and the respective inner long sides of the rectangular sides spacing and effecting a side by side relationship with respect to each other. Inside the housing, a first series piezoelectric resonator is resiliently held or seized by the contact of a first terminal member and the contact of a second terminal member, with a first parallel piezoelectric resonator being held by the contact of a third terminal member and the contact of a fourth terminal member. On the other hand, a second series piezoelectric resonator is resiliently held by the contact of a fifth terminal member and the contact of a sixth terminal member, with a second parallel piezoelectric resonator being resiliently held by the contact of a seventh terminal member and the contact of an eighth terminal member. The electric insulating spacer is disposed between the fourth terminal member and the fifth terminal member so as to electrically insulate them with respect to each other. The first terminal member is connected to a first lead terminal (i.e., the input terminal side) with a first lead wire, with the fourth and eighth terminal members being parallelly connected to a second lead terminal and a fourth lead terminal through a second lead wire. Furthermore, the sixth terminal member and the seventh terminal member are connected to a third lead terminal (i.e., the output terminal side) through a third lead wire. The second terminal member and the third terminal member and the fifth terminal member are connected with respect to each other through a fourth lead wire.

By the arrangement of the present invention as described above, the ladder-type piezoelectric filter according to the present invention is constituted in a compact size. Moreover, the occurrence of spurious signals in the vicinity of the central frequency of the filter is arranged to be suppressed as far as possible.

BRIEF DESCRIPTION OF THE DRAWINGS

These and other objects and features of the present invention will become apparent from the following description taken in conjunction with the preferred embodiment thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Figure 3:
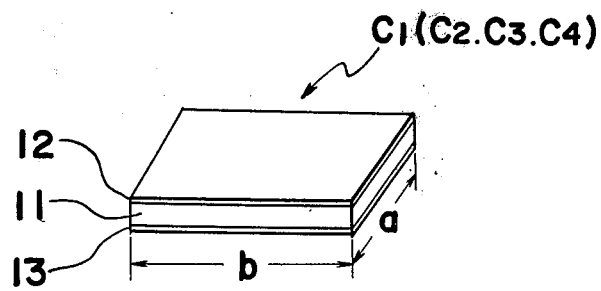
FIG. 3 is a perspective view showing a piezoelectric resonator according to the present invention, which is incorporated in the ladder-type piezoelectric filter of the present invention.
Figure 2:
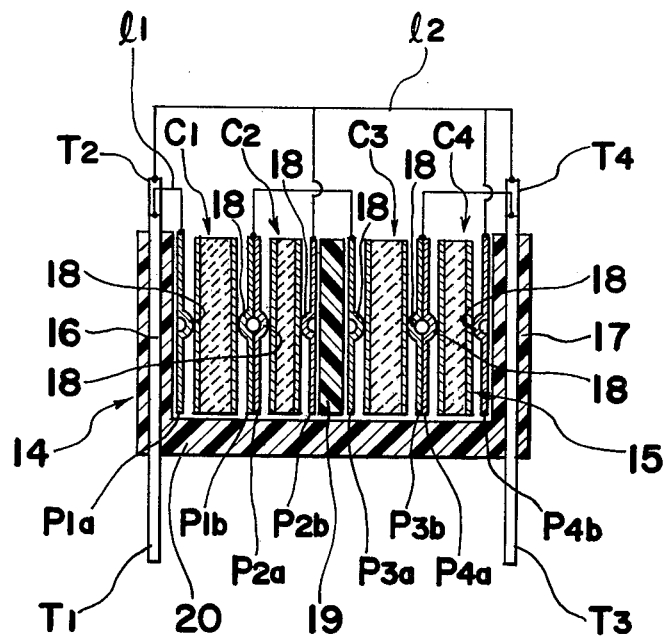
FIG. 2(a) is a schematic cross sectional view of a ladder-type piezoelectric filter according to the present invention.
FIG. 2(b) is a side view of the embodiment shown in FIG. 2(a), while being provided with a lid-portion.
Figure 2:
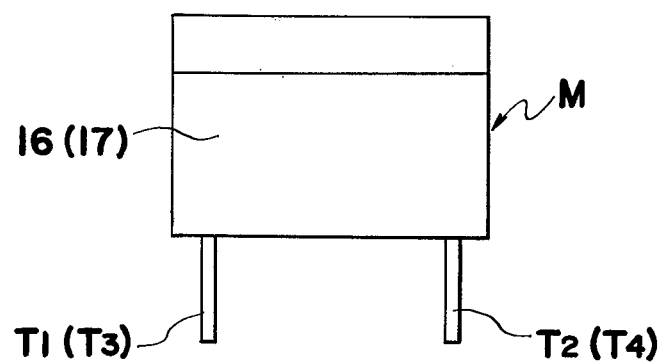

Referring now to FIGS. 2(a) and 2(b), there is shown a piezoelectric filter M of the ladder type according to the present invention, which comprises a plurality of piezoelectric resonators $C_1$, $C_2$, $C_3$ and $C_4$ accommodated in a casing 14. According to the present invention, each piezoelectric resonator is constituted by a ceramic element 11 (see FIG. 3) made of a piezoelectric material selected from the group of $Pb(Zr,Ti)O_3$ or the like, having its opposing surfaces deposited with electrodes 12 and 13 of known fabrication.

The respective ceramic elements 11 are manufactured by a sintering process, each being formed in a shape wherein the ratio of a short side dimension a to a long side dimension b, i.e., (a/b), is arranged to be less than a value of 0.7 due to the reason as described hereinafter. Respective dimensions constituting a rectangular surface of the element 11, i.e., a and b, are both much larger than the thickness of the element 11. Furthermore, as shown in FIG. 2(a), respective thicknesses of these elements may be different, while the respective surface dimensions of these four elements are identical with respect to each other. The piezoelectrical resonators $C_1$ to $C_4$ are housed in the casing or housing 14 made of one of the electric insulating plastic resins such as an epoxy resin. The casing 14 has a U-shaped cross section while its substantially inner long side length of respective lateral, rectangular sides is arranged to be equivalent to the long side length b of each piezoelectric resonator so that it is capable of housing the piezoelectric resonators $C_1$ to $C_4$ therein, with these long side dimensions of the respective piezoelectric resonators and the respective inner long sides of the rectangular sides spacing and effecting a side by side relationship with respect to each other. On the other hand, a depth of the casing 14 may be equivalent to the short side length a of each piezoelectric resonators $C_1$ to $C_4$. Furthermore, two electroconductive lead terminals $T_1$ and $T_2$ are each insert-molded within one side wall 16 having a lengthwise length appropriately equivalent to the above-described length b, while within the other side wall 17 relatively opposite to the wall 16, two electroconductive lead terminals $T_3$ and $T_4$ are each insert-molded. The respective electroconductive lead terminals $T_1$ to $T_4$ are insert-molded such that respective head portions slightly project from respective top surfaces of the respective side walls 16 and 17, while respective leg-portions are each projected from the bottom surface of the casing 14 by a length long enough for the respective lead terminals to be attached to a printed wiring board (not shown) therewith. In FIG. 2(a), only for the sake of convenience of the drawing, respective projecting lengths of the head portions of the electroconductive lead terminals $T_2$ and $T_4$ are arranged to be somewhat longer than those of the terminals $T_1$ and $T_3$, since the respective electroconductive lead terminals $T_1$ and $T_2$ as well as the respective electroconductive lead terminals $T_3$ and $T_4$ are obliged to be drawn in an overlapping manner.

On either side of the respective piezoelectric resonators $C_1$ to $C_4$, there are provided electroconductive terminal plates $P_{1a}$, $P_{1b}$, ... $P_{4a}$, $P_{4b}$ each of which is made of any of the metallic materials having resilient characteristics such as a phosphor bronze and has slightly larger rectangular configuration, prior to the further treatment of extrusion described below, when compared with the respective resonators $C_1$ to $C_4$. Each terminal plate has a semi-circularly shaped protuberant contact 18 which is integrally configurated during extrusion of the plate. Each of these terminal plates contacts and is therefore electrically connected to a corresponding surface of the piezoelectric resonator through the electroconductive protuberance integrally formed therewith. More specifically, as is shown in FIG. 2(a), all the terminal plates $P_{1a}$, $P_{1b}$, ... $P_{4a}$, $P_{4b}$ as well as all the ceramic resonators $C_1$, ... $C_4$ are accommodated in the accommodating space 15 of the casing 14 in a manner as described below. The ceramic resonator $C_1$ is interposed or seized by the paired electroconductive protuberances 18 and 18 of the terminal plates $P_{1a}$ and $P_{1b}$ at its opposing central portions, while the ceramic resonator $C_2$ is seized by the paired protuberances 18 and 18 of the terminal plates $P_{2a}$ and $P_{2b}$. Similarly, the ceramic resonator $C_3$ is seized by the paired electroconductive protuberances 18 and 18 of the terminal plates $P_{3a}$ and $P_{3b}$ at its opposing central portions, while the ceramic resonator $C_4$ is seized by the paired protuberances 18 and 18 of the terminal plates $P_{4a}$ and $P_{4b}$. Furthermore, it is to be noted here that an electric insulating boardlike spacer 19 is disposed between the terminal plates $P_{2b}$ and $P_{3a}$, so that these terminal plates $P_{2b}$ and $P_{3a}$ are electrically insulated with respect to each other. After these terminal plates $P_{1a}$, $P_{1b}$, ... $P_{4a}$, $P_{4b}$, ceramic resonators $C_1$ to $C_4$ and the electric insulating spacer 19 are housed inside the accommodating space 15 of the casing 14 in a manner as described above, the respective terminal plates are connected to the respective lead terminals $T_1$ to $T_4$ as described hereinbelow, and the resultant assembled unit is further applied over by a covering member made of any of the electric insulating resins and the metallic materials thereby to seal up the assembled unit from the outside. With respect to the connections among the terminal plates and lead terminals, the terminal plate $P_{1a}$ is connected to the lead terminal $T_1$ with a lead wire $l_1$, with the respective terminal plates $P_{2b}$ and $P_{4b}$ being parallelly connected to the respective lead terminals $T_2$ and $T_4$ through a lead wire $l_2$. Furthermore, the terminal plates $P_{3b}$ and $P_{4a}$ are respectively connected to the lead terminal $T_3$ through a lead wire $l_3$, while the terminal plates $P_{1b}$, $P_{2a}$ and $P_{3a}$ are connected with respect to each other through a lead wire $l_4$.

Figure 1:
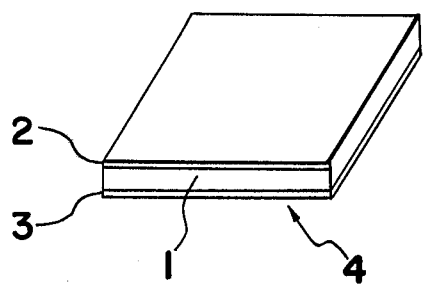
FIG. 1 is a perspective view showing a square-formed piezoelectric resonator to be employed as a constituent of the conventional ladder-type piezoelectric filter (Prior Art)
Figure 4:
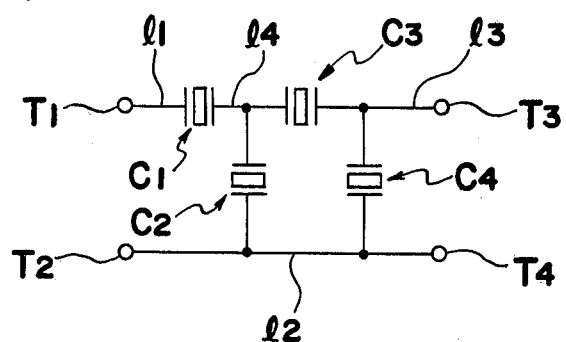
FIG. 4 is a circuit diagram of the embodiment shown in FIG. 2(a)

As shown in FIG. 4, when these terminal plates $P_{1a}$, $P_{1b}$, ... $P_{4a}$, $P_{4b}$ are connected with respect to each other in a manner as described above, the filter unit M as shown in FIGS. 2(a) and 2(b) is to constitute a two-staged ladder-type filter as shown in FIG. 4. More specifically, the ceramic resonator $C_1$ functions as a series resonator, with the ceramic resonator $C_2$ functioning as a parallel resonator, while the ceramic resonator $C_3$ functions as a series resonator, with the ceramic resonator $C_4$ functioning as a parallel resonator. The paired terminals $T_1$ and $T_2$ and the paired terminals $T_3$ and $T_4$ serve as input and output terminals, respectively.

Figure 5A:
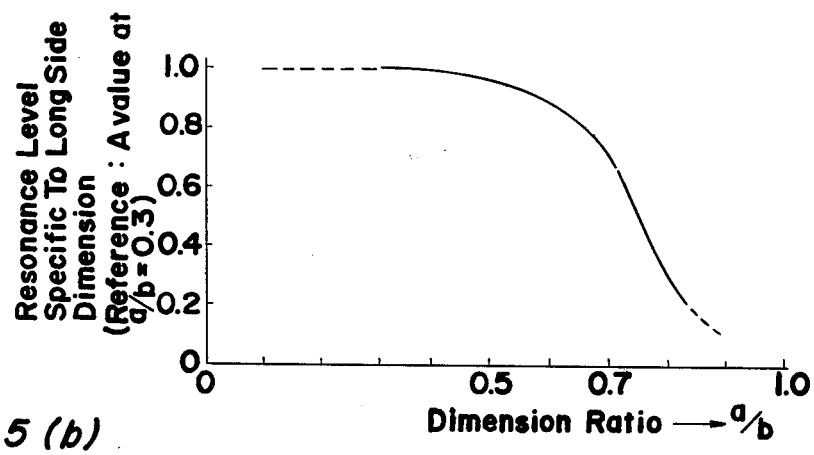
FIG. 5(a) is a graph showing a correlation between the resonance level specific to the long side dimension of the resonator shown in FIG. 3 and the ratio of the short side dimension to the long side dimension (a/b), while a resonance level specific to the long side dimension to be effected for the ratio (a/b) of 0.3 is chosen as a reference value.
Figure 5B:
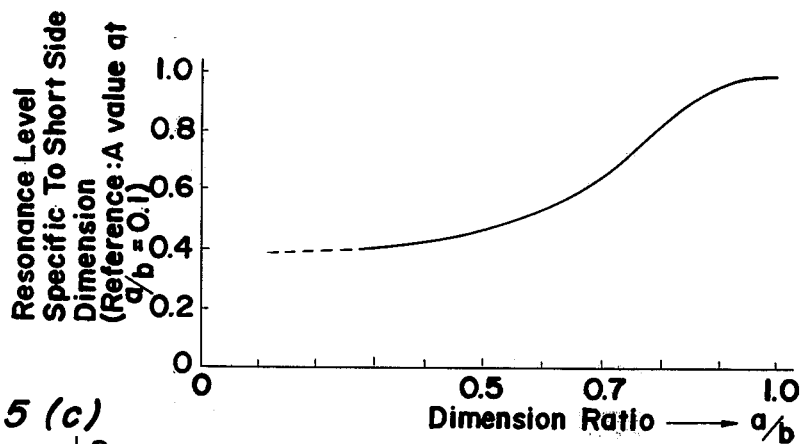
FIG. 5(b) is a graph showing a correlation between the resonance level specific to the short side dimension of the resonator shown in FIG. 3 and the ratio of the short side dimension to the long side dimension (a/b), while a resonance level specific to the short side dimension to be effected for the ratio (a/b) of 1.0 is chosen as a reference level.
Figure 5C:
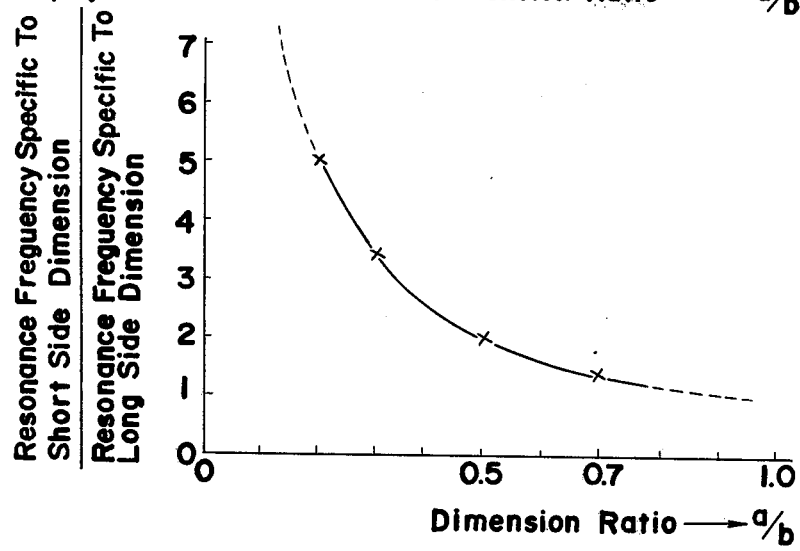
FIG. 5(c) is a graph showing a correlation between the ratio of the resonance frequency specific to the short side dimension to the resonance frequency specific to the long side dimension and the ratio of the short side dimension to the long side dimension (a/b)

With respect to the two-staged ladder-type ceramic filter formed in a manner as described above, the following various resonance and frequency characteristics were obtained by varying the ratio of the short side length a to the long side length b, that is to say the ratio (a/b) of the piezoelectric resonator. Since all the piezoelectric resonators $C_1$ to $C_4$ according to the present embodiment are arranged to be of similar construction, the following embodiments are conducted only for any of these piezoelectric resonators. The ratio (a/b) was ranged from the approximate value of 0.2 to the approximate value of 0.9. Referring now to FIG. 5(a), there is shown a correlation between a resonance level specific to the long side dimension and the ratio (a/b), while a resonance level specific to the long side dimension to be effected for the ratio (a/b) of 0.3 is chosen as a reference value. Referring now to FIG. 5(b), there is shown a correlation between a resonance level specific to the short side dimension and the ratio (a/b), while a resonance level specific to the short side dimension to be effected for the ratio (a/b) of 1.0 is chosen as reference value. Furthermore, in FIG. 5(c), there is shown a correlation between the ratio of a resonance frequency specific to the short side dimension to a resonance frequency specific to the long side dimension and the ratio (a/b). As is clear from these drawings, when the ratio (a/b) is less than 0.7, the resonance level specific to the long side dimension, which is corresponding to a substantial specific resonance level of the ceramic resonator of the present invention, is increased, while the resonance level specific to the short side dimension lies below the value of 0.6 or 0.7. Furthermore, in the range of the ratio (a/b) being less than 0.7 as described above, the ratio of the resonance frequency specific to the short side dimension to the resonance frequency specific to the long side dimension becomes more than an approximate value of 1.5. Accordingly, as far as the resonance level specific to the short side dimension is concerned, its respective values of the vibration level and the frequency are quite different from the respective values of the vibration level and the frequency specific to the long side dimension. Consequently, it is clear that the spurious signal characteristics in the vicinity of the central frequency of the filter can be considerably improved or suppressed when these resonators each having the ratio of the value of less than 0.7 are assembled as the filter. Furthermore, the frequencies inherent in spurious signals in the vicinity of the central frequency described above can be easily regulated by varying the value of (a/b).

As the result, according to the ladder-type ceramic filter of the present invention as described in the foregoing, owing to the arrangement wherein the value of (a/b) is less than 0.7, the substantial height of the ladder-type ceramic filter according to the present invention is relatively decreased by 30 percent or more when compared with the conventional ladder-type ceramic filters.

Figure 6A:
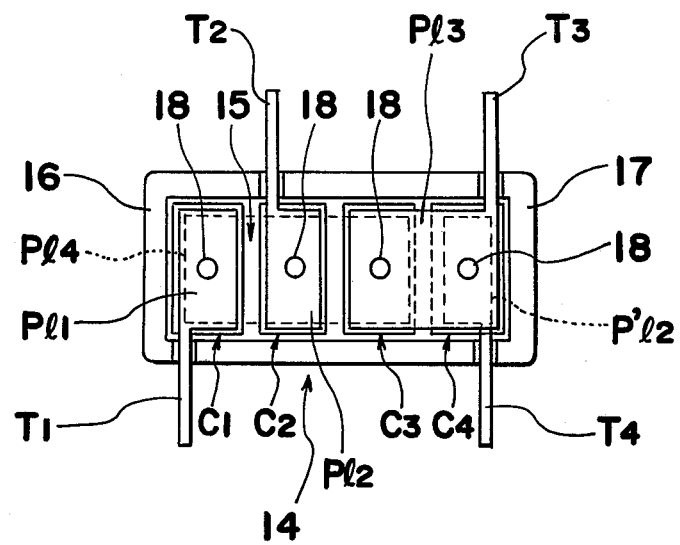
FIG. 6(a) is a schematic top plain view of a modified embodiment of the ladder-type piezoelectric filter according to the present invention.
Figure 6B:
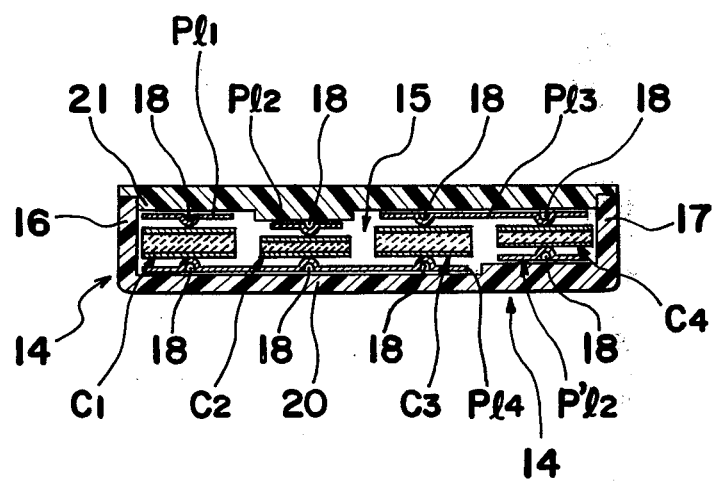
FIG. 6(b) is a schematic cross sectional view of the embodiment shown in FIG. 6(a).

Referring now to FIGS. 6(a) and 6(b), there is shown a modified embodiment of the ladder-type ceramic filter according to the present invention. According to this embodiment, four piezoelectric resonators $C_1$ to $C_4$, each of which is of similar construction with respect to each other, are respectively identical to those employed for the embodiment shown in FIGS. 2(a) and 2(b), and are housed in a space 15 within a casing or housing 14 as described hereinbelow. Each of the four piezoelectric resonators is housed in the housing 14 in a manner such that the opposing surfaces of each resonator described earlier are respectively spaced with respect to respective inner surfaces of respective lid portion 21 and a bottom portion 18 of the housing 14 while each being resiliently seized or held by the respective protuberant contacts 18 and 18 at both surfaces described above. More specifically, according to the embodiment, respective terminal plates $P_{l1}$, $P_{l2}$, $P_{l3}$, $P_{l4}$ and $P'_{l2}$ each having an appropriate number of electroconductive protuberances on its one side surface, are provided on both inner sides of the respective lengthwise sides of the assembled casing 15 and lid portion 21, so that each resonator is seized by the confronting terminal plates through respectively paired electroconductive protuberances 18 and 18.

With respect to lead terminals of these terminal plates, the respective terminal plates $P_{l1}$, $P_{l2}$ and $P_{l3}$ are each provided with their own terminal leads, i.e., $T_1$ for $P_{l1}$, $T_2$ for $P_{l2}$ and $T_4$ for $P'_{l2}$, while each terminal lead extends from one side circumference of each terminal plate. However, the terminal plate $P_{l3}$ is integrally provided with two separate protuberances 18 and 18 so that respective electrodes 12 and 12 each provided for the respective piezoelectric resonators $C_3$ and $C_4$ may be electrically conducted, and with one lead terminal $T_3$ extending from one side circumference to cause these electrodes to be electrically connected to the other provisions (not shown here). The terminal plate $P_{l4}$ is integrally provided with three separate protuberances 18, 18 and 18, whereby respective electrodes 13, 13 and 13 of the respective piezoelectric resonators $C_1$, $C_2$ and $C_3$ are mutually electrically conducted.

As long as the respective ceramic resonators $C_1$ to $C_4$ are assembled in one unit by introducing the above-described seizing arrangements of the resonators, such two-staged ladder-type filter as shown in FIG. 4 is correspondingly constituted. However, according to the above-described embodiment, since the respective terminal plates $P_{l2}$ and $P'_{l2}$ are not electrically conducted with respect to each other, it may be necessary for the lead terminals $T_2$ and $T_4$ to be mutually, electrically connected.

In spite of the introduction of the relatively different assembling mode of the piezoelectric resonators in FIGS. 6(a) and 6(b) when compared with the former embodiment of FIGS. 2(a) and 2(b), there can be provided the two-staged ladder-type ceramic filter of the above-described type, with the result that its functional electrical characteristics are not different from the former embodiment of the present invention. Further, the specific dimensional configuration of the embodiment of FIGS. 6(a) and 6(b) results in a low height dimension together with a compact outer appearance which almost corresponds to that of the so-called flat package of an I-C circuit.

According to the above-described embodiments, although the four lead terminals $T_1$ to $T_4$ are prepared for each embodiment, it is possible to provide a further modified embodiment wherein the lead terminal $T_2$ and $T_4$ are arranged to be contructed as a unitary lead terminal or an integrally formed lead terminal.

Although only the two-staged ladder-type ceramic filter comprising four ceramic piezoelectric resonators are specified, the concept of the present invention is not limited to those embodiments. Therefore, the piezoelectric ceramic resonator of the present invention may be adopted to construct a single-staged or a multi-staged (more than two stage) ceramic filter, if necessary.

As is clear from the description in the foregoing, according to the present invention, a plurality of rectangularly shaped piezoelectric resonators having the above-described specific ratio with respect to its rectangular dimensions are appropriately arranged in a casing to constitute the ladder-type filter by utilizing the specific resonance vibrational characteristics based on the lengthwise dimension of the resonator.

Accordingly, since for each resonator the ratio of the short side length to the long side length is arranged to be less than 0.7 due to the phenomenological features previously described, these resonators are arranged to provide a compact ladder-type filter which can be manufactured at low cost in comparison with the conventional ladder-type ceramic filter.

As described previously, since the above-described dimensional ratio of the piezoelectric resonator is arranged to be less than the value of 0.7 so that the resonance level and the resonance frequency are specific to the long side dimension, this resonance level corresponding to the overall resonance level of the piezoelectric resonator. The resonance level and frequency are relatively larger than those specific to the short side dimension, the respective vibration level together with the frequency of the resonance level specific to the short side dimension can be adapted to be quite different from or apart from those specific to the long side dimension. Thus, the spurious signal characteristics in the vicinity of the central frequency are resultantly improved to a large extent.

Furthermore, subject to the appropriate selection of the above-described ratio, the specific frequency characteristics of the spurious signals can be modified, with resultant effects as follows. More specifically, as far as the ladder-type filter is concerned, the specific spurious characteristics to be effected by the respective series resonators and the specific spurious characteristics to be effected by the respective parallel resonators can be arranged to be cancelled with respect to each other. Moreover, when the present ladder-type filter is appropriately combined with or incorporated in a filter including an electric element or elements having inductance components and capacitor components, the occurrence of spurious signals is completely restrained or suppressed.

Although the present invention has been fully described by way of example with reference to the accompanying drawings, it is to be noted here that various changes and modifications are apparent to those skilled in the art. Therefore, unless otherwise such changes and modifications depart from the scope of the present invention, they should be construed as included therein.

What is claimed is:

1. In a piezoelectric resonator to be used for a component of a ladder-type piezoelectric filter, said resonator being defined by an element made of a polycrystalline piezoelectric material and having electrode layers located on its opposing surfaces said electrode layers causing said resonator to vibrate in a length-wise extension mode at a predetermined fundamental frequency of said mode when a voltage at said predetermined frequency is applied thereto, the improvement of said piezoelectric resonator having its said opposing surfaces of a rectangular shape and in whidch the ratio of a short side length to a long side length of the rectangular shape is less than a value of 0.7.

2. A piezoelectric resonator as claimed in claim 1, wherein said piezoelectric material is one selected from the group consisting of $Pb(Zr,Ti)O_3$.

3. A ladder-type piezoelectric filter which comprises:
   a housing of electrically insulating material, said housing having upper and bottom covering portions; and
   at least one set of paired piezoelectric resonators each including a series piezoelectric resonator and a parallel piezoelectric resonators, wherein each said resonator comprises a polycrystalline piezoelectric material and has on its opposing surface electrode layers causing said resonator to vibrate in a lengthwise extension mode at a predetermined fundamental frequency of said mode when a voltage at said predetermined frequency is applied thereto, with each of said opposing surfaces being formed in a rectangular shape wherein the ratio of a short side length to a long side length is less than a value of 0.7, said upper and bottom covering portions of said housing each being generally in a geometrically parallel relationship with a print board on which said housing is mounted, each of said piezoelectric resonators being housed in said housing in a manner such that said opposing surfaces are respectively spaced a predetermined distance from and in face-to-face relation with respective inner surfaces of said upper and bottom covering portions of said housing.

4. A ladder-type piezoelectric filter as claimed in claim 3, wherein said filter further comprises:
   a plurality of terminal members each having at least one electroconductive protuberant contact, each said electroconductive protuberant contact serving to engage one of said piezoelectric resonators at the central part of its one of said electrode layers; and
   at least four lead terminals wherein a first lead terminal and a second lead terminal serve as an input terminal, with a third lead terminal and a fourth lead terminal serving as an output terminal for said terminal members.

5. A ladder-type piezoelectric filter as claimed in claim 4, wherein said second lead terminal and said fourth lead terminal are portions of a unitary conducting structure.

6. A ladder-type piezoelectric filter as claimed in claim 4, wherein the number of sets of said paired piezoelectric resonators is two, each of said four piezoelectric resonators being housed in said housing in a manner such that said opposing surfaces are respectively spaced with respect to respective inner surfaces of respective said upper and bottom covering portions of said housing while being engaged by said protuberant contacts at both said surfaces, said inner surface of said upper covering portion being provided with a first terminal member, a second terminal member and a third terminal member having two said protuberant contacts, and said inner surface of said bottom covering portion being provided with a fourth terminal member having three said protuberant contacts and with a fifth terminal member, a first series piezoelectric resonator being engaged by respective said contacts of said first terminal member and said fourth terminal member, with a first parallel piezoelectric resonator being engaged by respective said contacts of said second terminal member and said fourth terminal member, a second series piezoelectric resonator being engaged by said contacts of said third terminal member and said fourth terminal member, with a second parallel piezoelectric resonator being engaged by respective said contacts of said third terminal member and said fifth terminal member, said first terminal member being provided with a first lead terminal, said second terminal member being provided with a second lead terminal, said third terminal member being provided with a third lead terminal, said fifth terminal member being provided with a fourth lead terminal, and said second lead terminal and said fourth lead terminal being electrically connected.

* * * * *